US012682958B2

(12) United States Patent
Woo

(10) Patent No.: US 12,682,958 B2
(45) Date of Patent: Jul. 14, 2026

(54) MEMORY DEVICE AND METHOD OF ERASURE OPERATIONS USING GIDL AND NEGATIVE WORDLINE VOLTAGES

(71) Applicant: SK hynix Inc., Icheon-si (KR)

(72) Inventor: Chang Beom Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 87 days.

(21) Appl. No.: 18/657,248

(22) Filed: May 7, 2024

(65) Prior Publication Data

US 2025/0149095 A1 May 8, 2025

(30) Foreign Application Priority Data

Nov. 8, 2023 (KR) ........................ 10-2023-0153529

(51) Int. Cl.
*G11C 16/16* (2006.01)
*G11C 13/00* (2006.01)
*G11C 16/04* (2006.01)
*G11C 16/08* (2006.01)
*G11C 16/14* (2006.01)

(52) U.S. Cl.
CPC .......... *G11C 16/16* (2013.01); *G11C 13/0097* (2013.01); *G11C 16/0483* (2013.01); *G11C 16/08* (2013.01); *G11C 16/14* (2013.01); *G11C 2211/5648* (2013.01); *G11C 2216/04* (2013.01); *G11C 2216/18* (2013.01)

(58) Field of Classification Search
CPC . G11C 16/16; G11C 13/0097; G11C 16/0483; G11C 16/08; G11C 2211/5648; G11C 2216/04; G11C 2216/18; G11C 16/14; G11C 16/30
See application file for complete search history.

(56) References Cited

U.S. PATENT DOCUMENTS

| | | | | |
|---|---|---|---|---|
| 2016/0049201 A1* | 2/2016 | Lue | ........................ | G11C 16/16 |
| | | | | 365/185.11 |
| 2022/0093180 A1* | 3/2022 | Kwon | ..................... | G11C 16/24 |
| 2023/0020251 A1* | 1/2023 | Or-Bach | ............. | G11C 11/5628 |
| 2024/0363168 A1* | 10/2024 | Prakash | ................. | G11C 16/14 |

FOREIGN PATENT DOCUMENTS

| | | |
|---|---|---|
| KR | 1020180054315 A | 5/2018 |
| KR | 102432717 B1 | 8/2022 |

* cited by examiner

*Primary Examiner* — Donald HB Braswell
(74) *Attorney, Agent, or Firm* — WILLIAM PARK AND ASSOCIATES LTD.

(57) ABSTRACT

A memory device and a method of operating the same are provided. The memory device may include a memory block including a plurality of memory cells, peripheral circuits configured to perform an erase operation including a gate induced drain leakage (GIDL) current generation operation and a data erase operation using an GIDL current on the memory block, and control logic configured to control the peripheral circuits to perform the erase operation, wherein the control logic is configured to control the peripheral circuits to apply a negative voltage to word lines of the memory block during the GIDL current generation operation.

19 Claims, 9 Drawing Sheets

Figure 2:
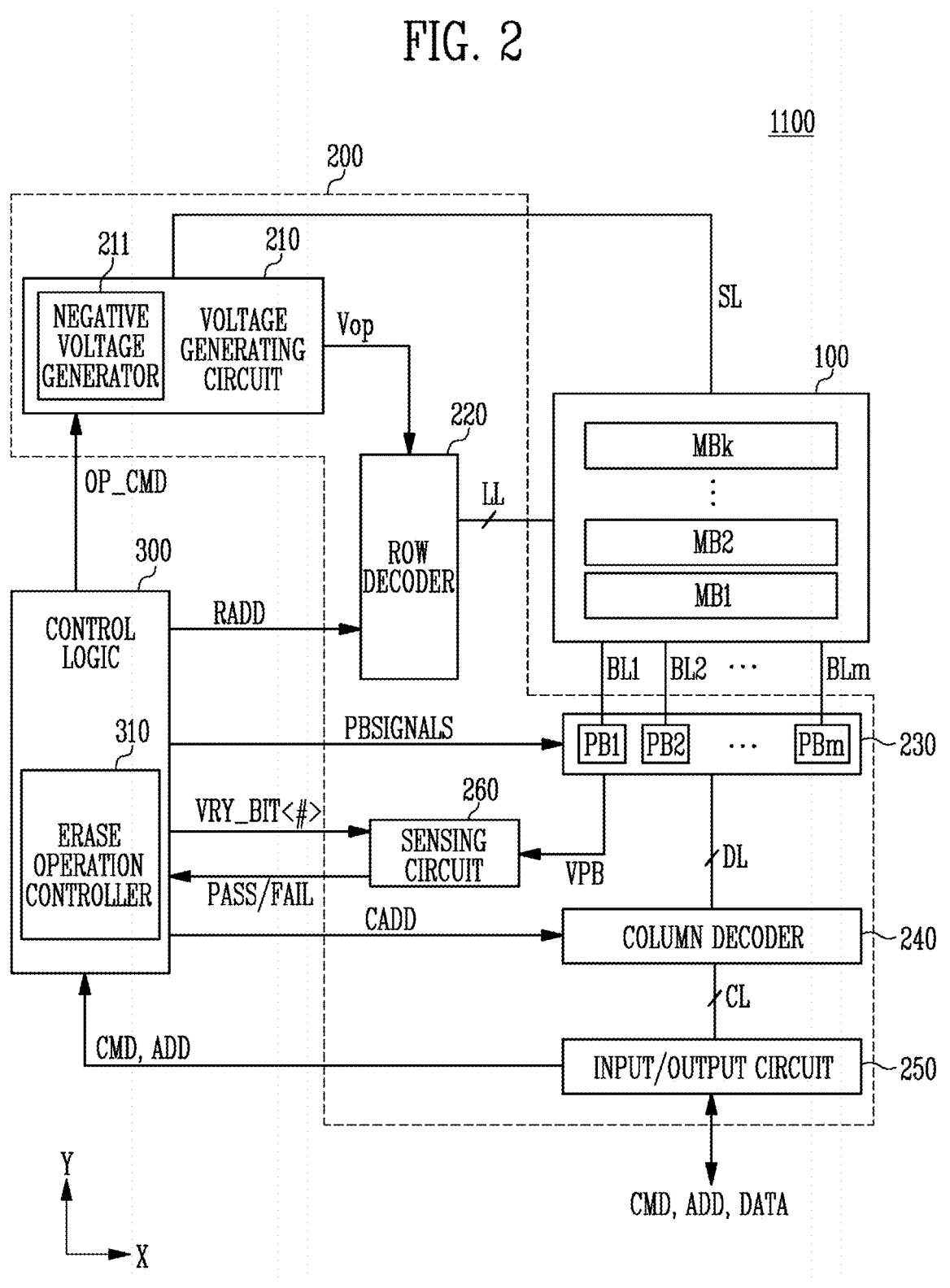

211 · NEGATIVE VOLTAGE GENERATOR

210 · VOLTAGE GENERATING CIRCUIT

Vop

SL

100

MBk
⋮
MB2
MB1

220 · ROW DECODER

LL

OP_CMD

300 · CONTROL LOGIC

RADD

BL1  BL2  ···  BLm

310 · ERASE OPERATION CONTROLLER

PBSIGNALS

PB1  PB2  ···  PBm  — 230

VRY_BIT<#>

260 · SENSING CIRCUIT

VPB

DL

PASS/FAIL

CADD

COLUMN DECODER  — 240

CL

CMD, ADD

INPUT/OUTPUT CIRCUIT  — 250

CMD, ADD, DATA

Figure 5:
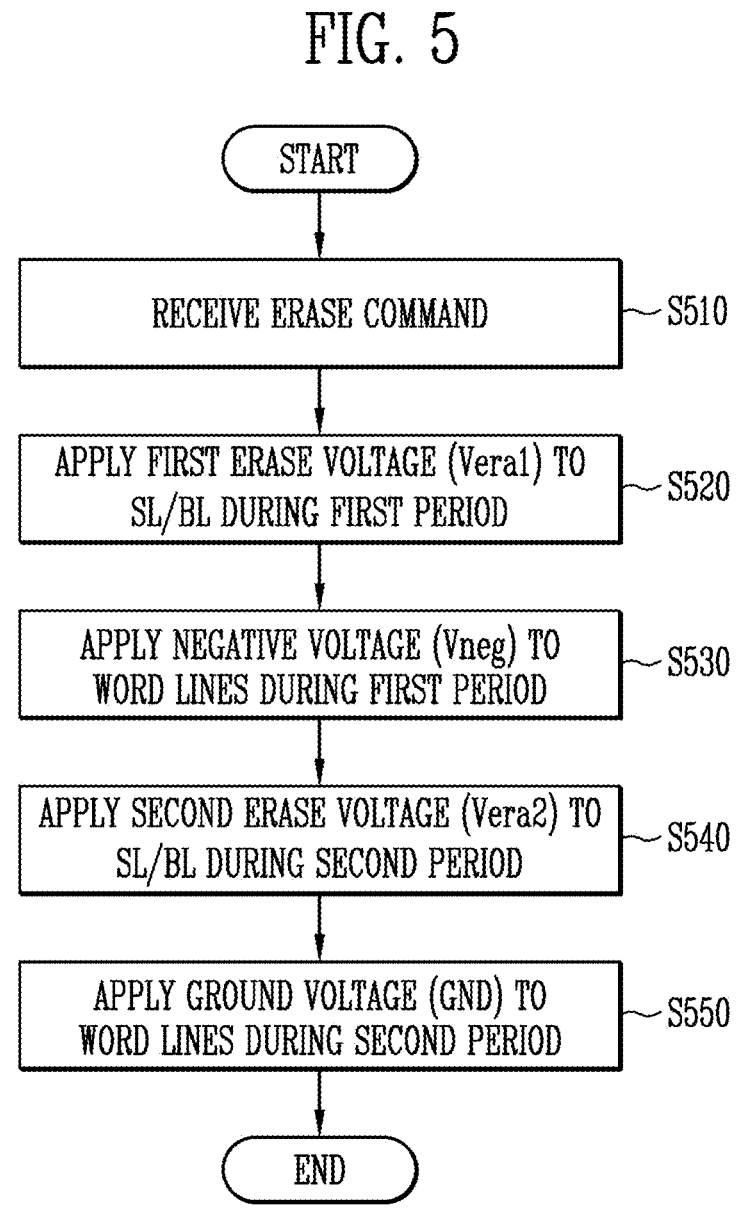

START

RECEIVE ERASE COMMAND — S510

APPLY FIRST ERASE VOLTAGE (Vera1) TO SL/BL DURING FIRST PERIOD — S520

APPLY NEGATIVE VOLTAGE (Vneg) TO WORD LINES DURING FIRST PERIOD — S530

APPLY SECOND ERASE VOLTAGE (Vera2) TO SL/BL DURING SECOND PERIOD — S540

APPLY GROUND VOLTAGE (GND) TO WORD LINES DURING SECOND PERIOD — S550

END

MEMORY DEVICE AND METHOD OF ERASURE OPERATIONS USING GIDL AND NEGATIVE WORDLINE VOLTAGES

CROSS-REFERENCE TO RELATED APPLICATION

The present application claims priority under 35 U.S.C. § 119(a) to Korean patent application number 10-2023-0153529, filed in the Korean Intellectual Property Office on Nov. 8, 2023, which application is incorporated herein by reference in its entirety.

BACKGROUND

1. Technical Field

Various embodiments of the present disclosure relate to an electronic device, including, but not limited to, a memory device and a method of operating the memory device.

2. Related Art

Among semiconductor devices, memory devices are broadly classified as volatile memory devices and nonvolatile memory devices.

The nonvolatile memory device has relatively low write and read speeds, but retains data stored even when the device's power supply is interrupted. Therefore, the nonvolatile memory device is typically used to store data to be retained regardless of whether power is supplied. Representative examples of a nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and so forth. The flash memory is classified into a NOR type and a NAND type.

Flash memory has the advantage of RAM in which data is freely programmable and erasable and the advantage of ROM in which stored data can be preserved even when the memory's power supply is interrupted. Such flash memory is widely used as the storage medium of portable electronic devices such as a digital camera, a personal digital assistant (PDA), and an MP3 player.

SUMMARY

An embodiment of the present disclosure may provide for a memory device. The memory device may include a memory block including a plurality of memory cells, peripheral circuits configured to perform an erase operation including a gate induced drain leakage (GIDL) current generation operation and a data erase operation using an GIDL current on the memory block, and control logic configured to control the peripheral circuits to perform the erase operation, wherein the control logic is configured to control the peripheral circuits to apply a negative voltage to word lines of the memory block during the GIDL current generation operation.

An embodiment of the present disclosure may provide for a memory device. The memory device may include a memory block including a plurality of memory cells, a voltage generating circuit configured to generate a first erase voltage and apply the first erase voltage to a source line of the memory block during a GIDL current generation operation of an erase operation, and to generate a second erase voltage and apply the second erase voltage to the source line during a data erase operation of the erase operation, a row decoder configured to apply an operating voltage to word lines of the memory block, and an erase operation controller configured to control the voltage generating circuit and the row decoder during the erase operation; wherein the voltage generating circuit comprises a negative voltage generator; and wherein the erase operation controller is configured to control the negative voltage generator to generate a negative voltage and control the row decoder to apply the negative voltage to the word lines during the GIDL current generation operation.

An embodiment of the present disclosure may provide for a method of operating a memory device. The method may include applying a first erase voltage to a source line or bit lines of a memory block during a first period, applying a negative voltage to word lines of the memory block during at least part of the first period, applying a second erase voltage to the source line or the bit lines during a second period following the first period, and applying a ground voltage to the word lines during the second period.

An embodiment of the present disclosure may provide for method of operating a memory device. The method may include, during a first period: applying a first erase voltage to a source line or bit lines of a memory block at least until the first erase voltage reaches a voltage threshold, wherein a gate induced drain leakage current is generated when the first erase voltage reaches the voltage threshold, causing a drain select line and a source select line to float when the first erase voltage reaches the voltage threshold, and applying a negative voltage to word lines of the memory block; and during a second period following the first period: applying a second erase voltage to the source line or the bit lines during and applying a ground voltage to the word lines.

BRIEF DESCRIPTION OF THE DRAWINGS

FIG. 2 is a diagram illustrating a memory device according to an embodiment of the present disclosure.

FIG. 5 is a flowchart illustrating an erase operation of a memory device according to an embodiment of the present disclosure.

DETAILED DESCRIPTION

Specific structural or functional descriptions in the embodiments of the present disclosure introduced in this specification or application are provided as examples to describe embodiments according to the concepts of the present disclosure. The embodiments according to the concepts of the present disclosure may be practiced in various forms, and should not be construed as being limited to the embodiments described in the specification or application.

Various embodiments of the present disclosure are described in detail with reference to the accompanying drawings to describe the present disclosure in detail such that those skilled in the art to which the present disclosure pertains can easily practice the technical aspects of the present disclosure.

Various embodiments of the present disclosure are directed to a memory device and a method of operating the memory device, which are capable of improving the erase characteristics of the memory device.

Figure 1:
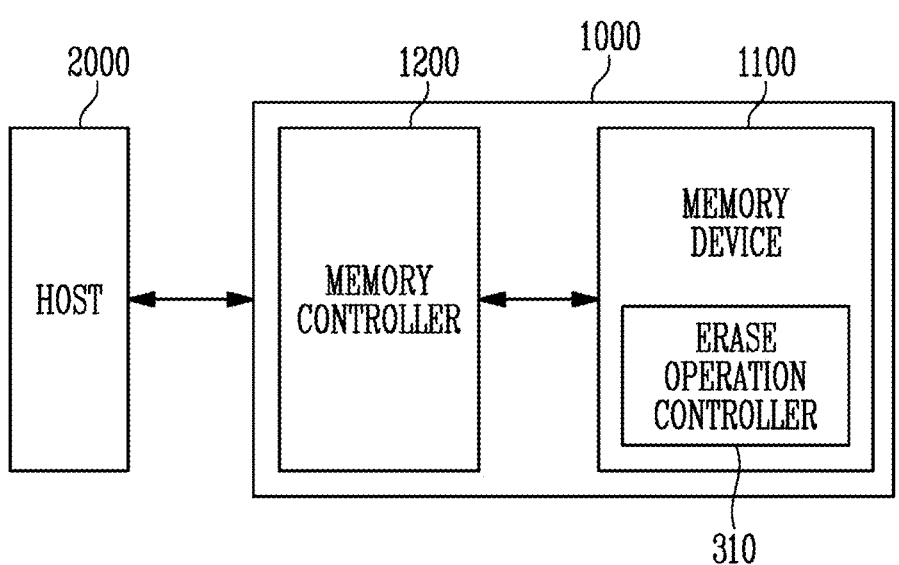
FIG. 1 is a diagram illustrating a memory system according to an embodiment of the present disclosure.

FIG. 1 is a diagram illustrating a memory system according to an embodiment of the present disclosure.

Referring to FIG. 1, under the control of a host 2000, a memory system 1000 includes a memory device 1100 that stores data and a memory controller 1200 that controls the memory device 1100.

The host 2000 is capable of communicating with the memory system 1000 using an interface protocol, such as peripheral component interconnect-express (PCI-E), advanced technology attachment (ATA), serial ATA (SATA), parallel ATA (PATA) or serial attached SCSI (SAS). In addition, the interface protocol between the host 2000 and the memory system 1000 is not limited to the above-described examples, and may be one of various other interface protocols, such as universal serial bus (USB), multimedia card (MMC), enhanced small disk interface (ESDI), and integrated drive electronics (IDE).

The memory controller 1200 controls the overall operation of the memory system 1000 and controls data exchange between the host 2000 and the memory device 1100. For example, the memory controller 1200 programs or reads data by controlling the memory device 1100 in response to a request received from the host 2000. For example, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus DRAM (RDRAM) or a flash memory.

The memory device 1100 performs a program operation, a read operation, and an erase operation under the control of the memory controller 1200.

The memory device 1100 includes an erase operation controller 310. The erase operation controller 310 controls the erase operation of the memory device 1100. For example, the erase operation controller 310 controls the peripheral circuits of the memory device 1100 to perform a gate induced drain leakage (GIDL) current generation operation on a selected memory block and a data erase operation on memory cells using a GIDL current during the erase operation of the memory device 1100. The erase operation controller 310 may additionally control the peripheral circuits to apply a negative voltage to word lines of the selected memory block during the GIDL current generation operation. Accordingly, during the GIDL current generation operation, the channel potential of the selected memory block may rapidly increase, and thus erase efficiency may be improved.

FIG. 2 is a diagram illustrating the memory device, for example, as shown in FIG. 1.

Referring to FIG. 2, the memory device 1100 includes a memory cell array 100 in which data is stored. The memory device 1100 includes peripheral circuits 200 configured to perform a program operation for storing data in the memory cell array 100, a read operation for outputting the stored data, and an erase operation for erasing the stored data. The memory device 1100 includes control logic 300 that controls the peripheral circuits 200 under the control of a memory controller (for example, memory controller 1200 of FIG. 1).

The memory cell array 100 includes a plurality of memory blocks MB1 to MBk (where k is a positive integer). Local lines LL and bit lines BL1 to BLm (where m is a positive integer) are coupled to each of the memory blocks MB1 to MBk. For example, the local lines LL includes a first select line, a second select line, and a plurality of word lines arranged between the first select line and the second select line. The local lines LL may include dummy lines, which may be arranged between the first select line and the word lines and between the second select line and the word lines. For example, the first select line may be a source select line, and the second select line may be a drain select line. For example, the local lines LL include the word lines, the drain select line and source select line, and source lines SL. For example, the local lines LL may include pipelines. In accordance with an embodiment of the present disclosure, the word lines may be divided into a plurality of groups.

The local lines LL are coupled to each of the memory blocks MB1 to MBk, and the bit lines BL1 to BLm are coupled in common to the memory blocks MB1 to MBk. Each of the memory blocks MB1 to MBk may be implemented in a two-dimensional (2D) or three-dimensional (3D) structure. For example, pages in the memory blocks having a 2D structure may be arranged in a direction horizontal to a substrate. For example, pages in the memory blocks having a 3D structure may be arranged in a direction vertical to a substrate.

The peripheral circuits 200 perform program, read, and erase operations on a selected memory block under the control of the control logic 300. For example, the peripheral circuits 200, under the control of the control logic 300, supply a verify voltage and a pass voltage to the first select line, the second select line, and the word lines, selectively discharge the first select line, the second select line, and the word lines, and verify memory cells coupled to a word line selected from among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 generates various operating voltages Vop that are used for program, read, and erase operations in response to an operation signal OP_CMD received from the control logic 300. The voltage generating circuit 210 selectively discharges the local lines LL in response to receiving the operation signal OP_CMD. For example, the voltage generating circuit 210 generates a program voltage, a verify voltage, a pass voltage, a turn-on voltage, a read voltage, an erase voltage, a source line voltage, a negative voltage, and so forth, all under the control of the control logic 300.

The voltage generating circuit 210 includes a negative voltage generator 211 in this embodiment. The negative voltage generator 211 is operated under the control of the erase operation controller 310 of the control logic 300 and generates a negative voltage applied to the word lines of the selected memory block during a GIDL current generation operation of the erase operation.

The row decoder 220 transfers or applies the operating voltage Vop to the local lines LL coupled to the selected memory block in response to receiving a row address RADD.

The page buffer group 230 includes a plurality of page buffers PB1 to PBm coupled to the bit lines BL1 to BLm, respectively. The page buffers PB1 to PBm are operated in response to receiving page buffer control signals PBSIG-NALS. For example, the page buffers PB1 to PBm temporarily store data received through the bit lines BL1 to BLm or sense voltages or currents of the bit lines BL1 to BLm during a read or verify operation. The page buffer group 230 applies the erase voltage to the bit lines BL1 to BLm of the memory cell array 100 during the erase operation.

The column decoder 240 transfers data between the input/output circuit 250 and the page buffer group 230 in response to receiving a column address CADD. For example, the column decoder 240 exchanges data with the page buffers PB1 to PBm through data lines DL or exchanges data with the input/output circuit 250 through column lines CL.

The input/output circuit 250 transmits a command CMD and an address ADD, received from the memory controller (for example, memory controller 1200 of FIG. 1), to the control logic 300 or exchanges data DATA with the column decoder 240.

During a read operation or a verify operation, the sensing circuit 260 generates a reference current in response to receiving an enable bit VRY_BIT<#> and compares a sensing voltage VPB received from the page buffer group 230 with a reference voltage generated by the reference current and outputs a pass signal PASS or a fail signal FAIL as a result of the comparison.

The control logic 300 controls the peripheral circuits 200 by outputting the operation signal OP_CMD, the row address RADD, the page buffer control signals PBSIG-NALS, and the enable bit VRY_BIT<#> in response to receiving the command CMD and the address ADD. In addition, the control logic 300 determines whether the verify operation passed or failed in response to receiving the pass or fail signal PASS/FAIL.

The control logic 300 controls the peripheral circuits 200 to perform a program operation or an erase operation on the memory block selected from among the plurality of memory blocks MB1 to MBk included in the memory cell array 100. According to an embodiment, when a command CMD corresponding to the erase operation is received, the control logic 300 controls the peripheral circuits 200 to perform an erase operation including decreasing the threshold voltages of memory cells included in the selected memory block to a level lower than a target threshold voltage.

The control logic 300 includes the erase operation controller 310 that controls the erase operation on the selected memory block. The erase operation controller 310 controls the peripheral circuits 200 to perform a GIDL current generation operation and a data erase operation on memory cells using a GIDL current during the erase operation on the selected memory block. The erase operation controller 310 controls the negative voltage generator 211 to generate the negative voltage, Vneg, applied to the word lines of the selected memory block during the GIDL current generation operation and controls the row decoder 220 to apply the negative voltage, Vneg generated by the negative voltage generator 211, to the word lines of the selected memory block.

Figure 3:
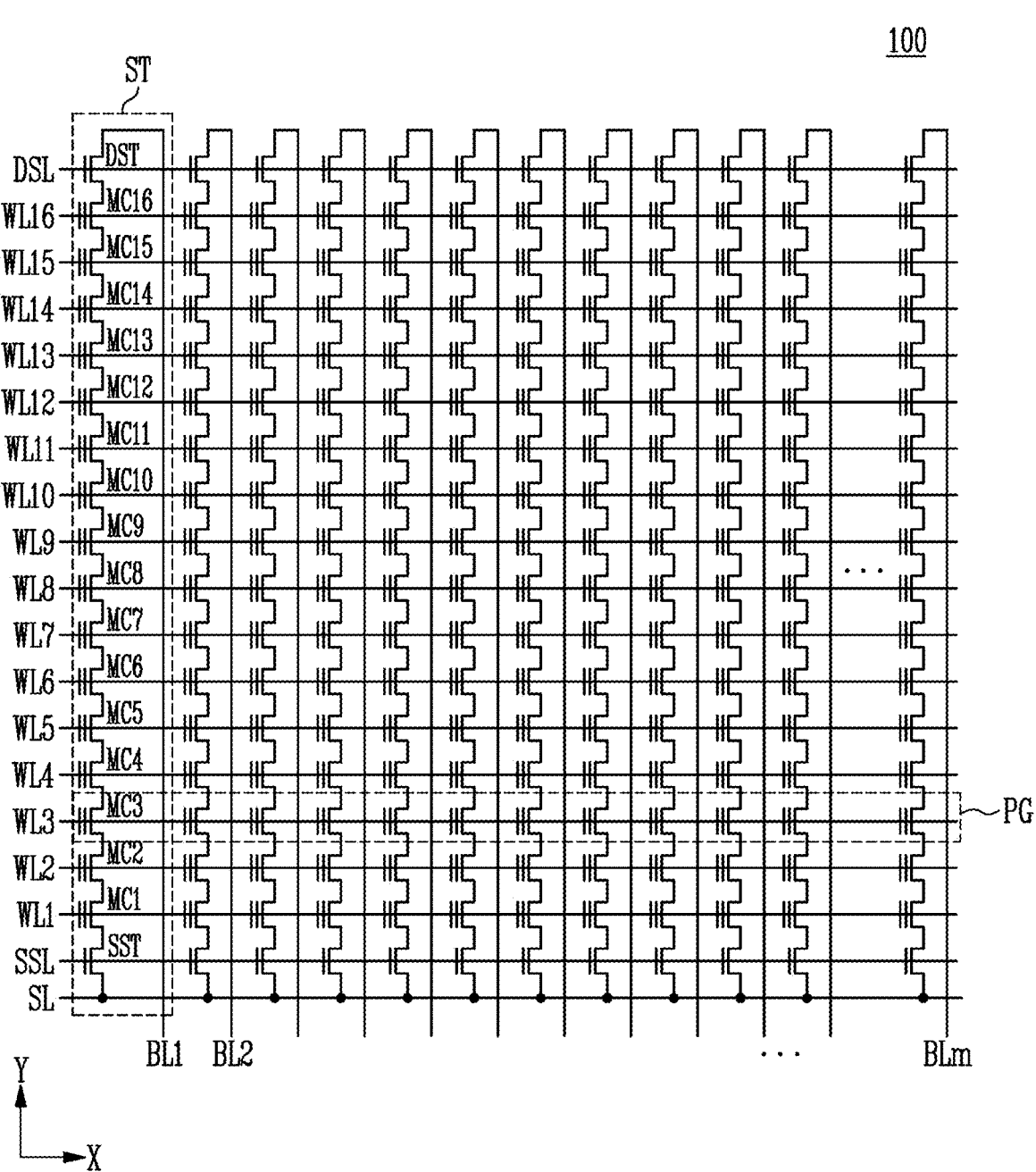
FIG. 3 is a diagram illustrating a memory block according to an embodiment of the present disclosure.

FIG. 3 is a diagram illustrating the memory block, for example, as shown in FIG. 2.

Referring to FIG. 3, a plurality of word lines arranged in parallel between a first select line and a second select line are coupled to the memory block. In this example, the first select line is a source select line SSL, and the second select line is a drain select line DSL. The memory block includes a plurality of memory strings ST coupled between bit lines BL1 to BLm and a source line SL. The bit lines BL1 to BLm are each coupled to a different one of the memory strings ST, and the source line SL is coupled in common to the memory strings ST. Because each of the memory strings ST may be similarly configured, one memory string ST coupled to the first bit line BL1 is described in detail as follows by way of example.

The memory string ST includes a source select transistor SST, a plurality of memory cells MC1 to MC16, and a drain select transistor DST that are connected in series to each other between the source line SL and the first bit line BL1. A single memory string ST may include at least one source select transistor SST and at least one drain select transistor DST, and more memory cells than the memory cells MC1 to MC16.

A source of the source select transistor SST is coupled to the source line SL, and a drain of the drain select transistor DST is coupled to the first bit line BL1. The memory cells MC1 to MC16 are connected in series between the source select transistor SST and the drain select transistor DST. Gates of the source select transistors SST included in different memory strings ST are coupled to the source select line SSL, gates of the drain select transistors DST included in different memory strings ST are coupled to the drain select line DSL, and gates of the memory cells MC1 to MC16 are coupled to a different one of plurality of word lines WL1 to WL16, respectively. A group of memory cells coupled to the same word line, among the memory cells included in different memory strings ST, may be referred to as a "page (PG)." The memory block may include a number of pages (PG) identical to the number of word lines WL1 to WL16.

Figure 4:
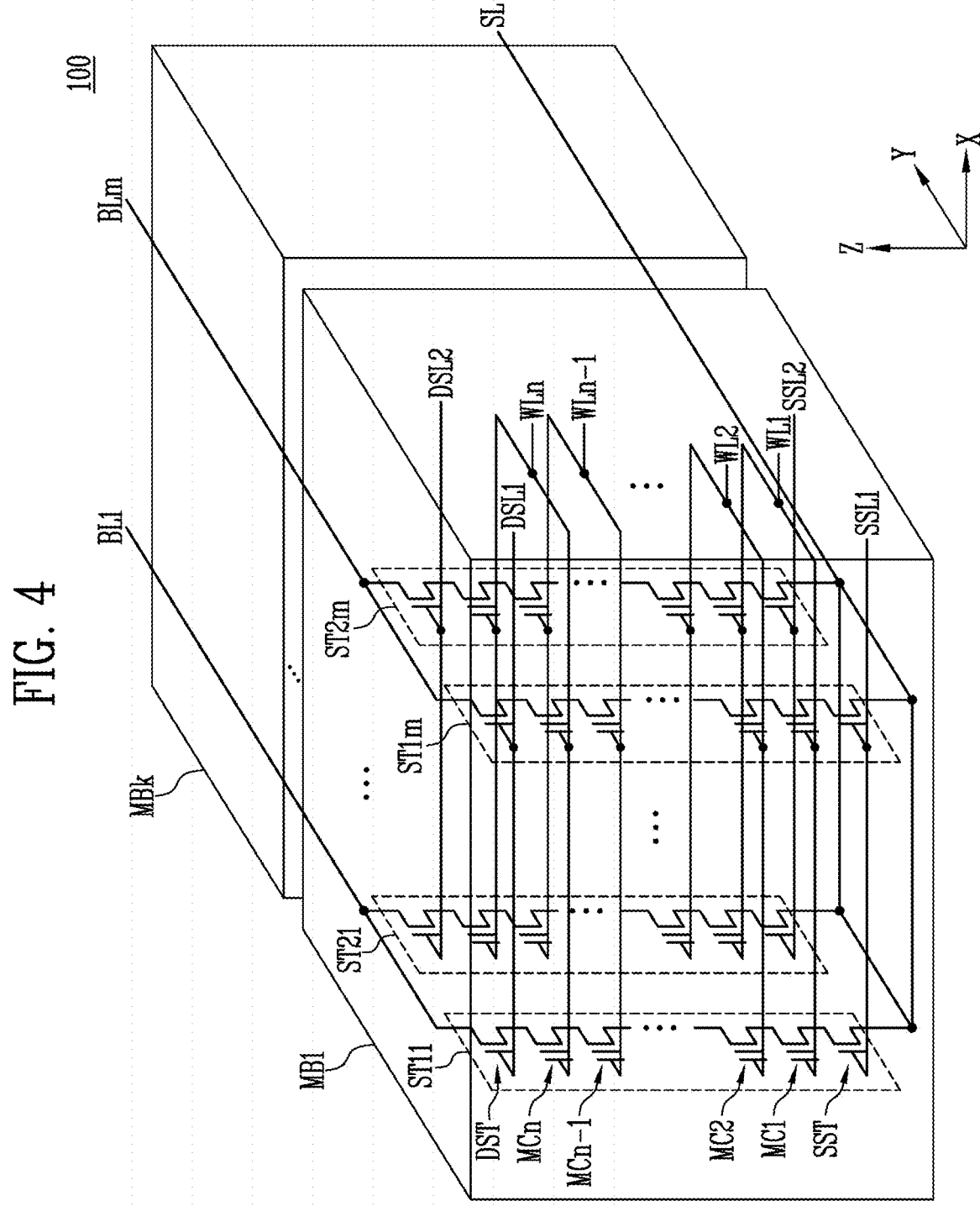
FIG. 4 is a diagram illustrating an embodiment of a memory block having a three-dimensional (3D) structure.

FIG. 4 is a diagram illustrating an embodiment of a memory block having a three-dimensional (3D) structure.

Referring to FIG. 4, the memory cell array 100 includes a plurality of memory blocks MB1 to MBk. In FIG. 4, for simplicity of description and the drawing, the internal configuration of the first memory block MB1 is illustrated, and the internal configuration of the remaining memory blocks MB2 to MBk is omitted. The second to k-th memory blocks MB2 to MBk are advantageously configured in the same manner as the first memory block MB1.

The first memory block MB1 includes a plurality of memory strings ST11 through ST1*m* and ST21 through ST2*m*. Each of the plurality of memory strings ST11 through ST1*m* and ST21 through ST2*m* extends in a vertical direction relative to the orientation of FIG. 4 (for example, the Z direction). In the first memory block MB1, m memory strings are arranged in a row direction (for example, the X direction). Although, in FIG. 4, two memory strings are illustrated as arranged in a column direction (for example, the Y direction), this embodiment is provided for convenience of description, and three or more memory strings may be arranged in the column direction (for example, the Y direction) in other embodiments.

Each of the memory strings ST11 through ST1*m* and ST21 through ST2*m* includes at least one source select transistor SST, the first memory cell MC1 through the n-th memory cell MCn, and at least one drain select transistor DST.

The source select transistor SST of each memory string is coupled between a source line SL and the memory cells MC1 through MCn. The source select transistors of memory strings arranged in the same row are coupled to the same source select line. For example, the source select transistors of the memory strings ST11 through ST1$m$ arranged in a first row are coupled to a first source select line SSL1. The source select transistors of the memory strings ST21 through ST2$m$ arranged in a second row are coupled to a second source select line SSL2 in another example. In an embodiment, the source select transistors of the memory strings ST11 through ST1$m$ and ST21 through ST2$m$ are coupled in common to one source select line.

The first memory cell MC1 through the n-th memory cell MCn in each memory string are connected in series between the source select transistor SST and the drain select transistor DST. Gates of the first memory cell MC1 through the n-th memory cell MCn are coupled to the first word lines WL1 through the n-th word line WLn, respectively.

In an embodiment, at least one of the memory cells MC1 to MCn is used as a dummy memory cell. When the dummy memory cell is provided, the voltage or current of the corresponding memory string is stably controlled. Accordingly, the reliability of data stored in the memory block MB1 may be improved.

The drain select transistor DST of each memory string is coupled between the corresponding bit line and the memory cells MC1 to MCn. The drain select transistors DST of memory strings arranged in the row direction are coupled to a drain select line extending along the row direction. For example, the drain select transistors DST of the memory strings ST11 through ST1$m$ in the first row are coupled to a first drain select line DSL1. The drain select transistors DST of the memory strings ST21 through ST2$m$ in the second row are coupled to a second drain select line DSL2 in another example.

FIG. 5 is a flowchart illustrating an erase operation of a memory device according to an embodiment of the present disclosure.

Figure 6:
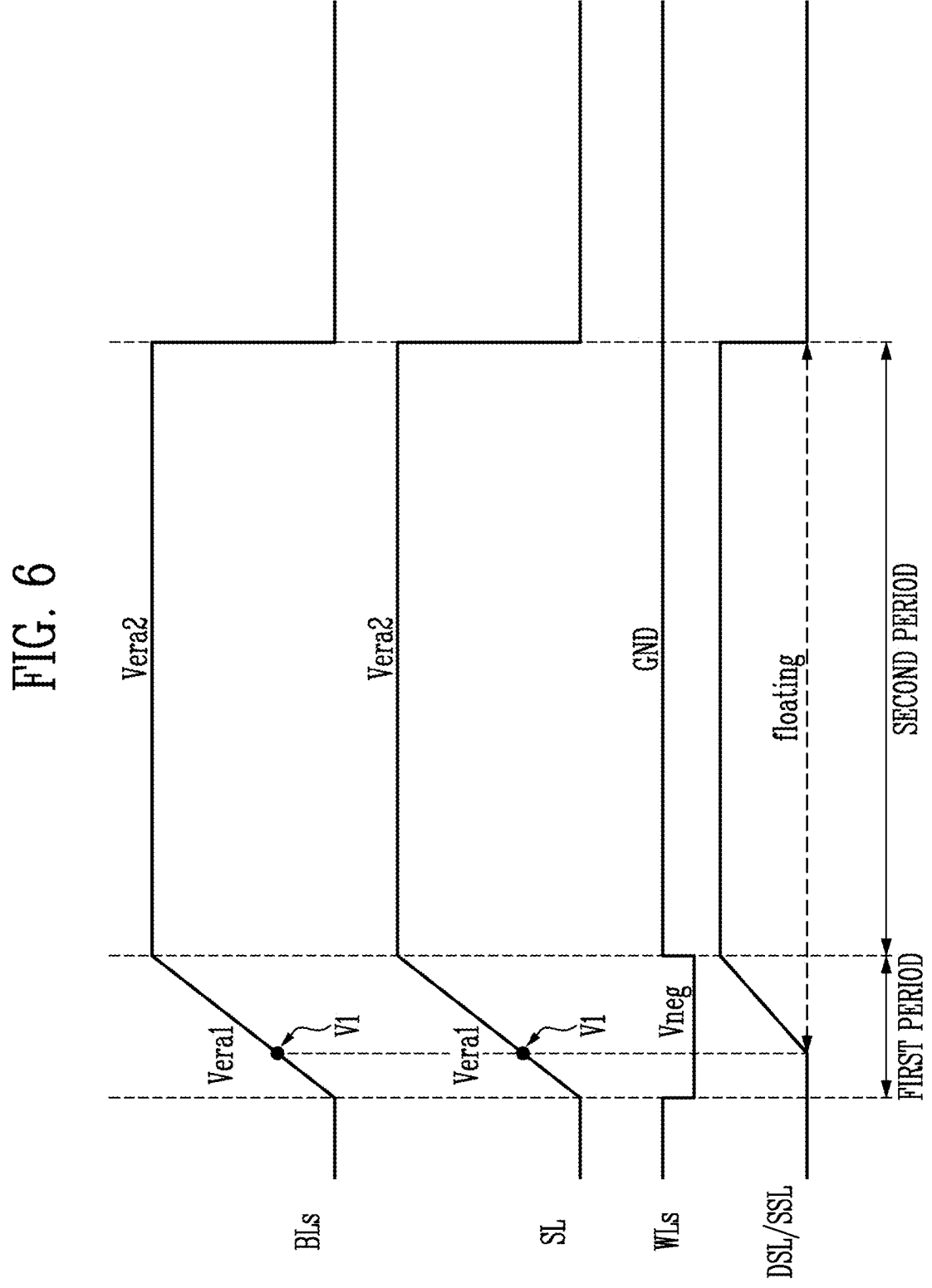
FIG. 6 is a timing diagram of signals during the erase operation of a memory device according to an embodiment of the present disclosure.

FIG. 6 is a timing diagram of signals during the erase operation of a memory device according to an embodiment of the present disclosure.

The erase operation of the memory device according to an embodiment of the present disclosure is described below with reference to FIG. 1 through FIG. 6.

The memory device 1100 receives S510 a command CMD corresponding to an erase operation and an address ADD corresponding to a memory block on which the erase operation is to be performed. The command CMD and the address ADD may be received from the memory controller 1200.

The control logic 300 of the memory device 1100 receives the command CMD and the address ADD, which correspond to the erase operation, from the input/output circuit 250, and controls the peripheral circuits 200 to perform the erase operation on a memory block (for example, MB1) corresponding to the address ADD.

A first erase voltage Vera1 is applied S520 to at least one of a source line SL and bit lines BLs during a first period. The first erase voltage Vera1 may be a positive voltage increasing with a constant slope. For example, the voltage generating circuit 210 applies the first erase voltage Vera1 to the source line SL coupled to the selected memory block MB1 in response to receiving an operation signal OP_CMD during the first period. The page buffer group 230 applies the first erase voltage Vera1 to bit lines BL1 to BLm (BLs) of the memory cell array 100 in response to receiving page buffer control signals PBSIGNALS during the first period.

The first period is a period during which a GIDL current generation operation is performed. The voltage generating circuit 210 generates the negative voltage during at least part of a period of the GIDL current generation operation.

A negative voltage Vneg is applied S530 to the word lines WLs of the selected memory block during the first period. For example, the negative voltage generator 211 of the voltage generating circuit 210 generates the negative voltage Vneg under the control of the erase operation controller 310 and applies the negative voltage Vneg generated by the negative voltage generator 211 to all word lines WLs of the selected memory block. The negative voltage generator 211 generates the negative voltage Vneg during at least part of the first period. Vneg is a voltage lower than a ground voltage.

During the first period, the ground voltage is applied to the drain select line DSL and the source select line SSL, for example, by the row decoder 220. The drain select transistor DST and the source select transistor SST are therefore in a turned-off state. Because the drain select transistor DST and the source select transistor SST are in a turned-off state, current does not flow through channel regions of the memory cells.

The first erase voltage Vera1 gradually increases, and the potential reaches V1, such as shown in FIG. 6. That is, the potential of at least one of the source line SL and the bit lines BLs reaches V1. In one example, a potential difference between the gate of the source select transistor SST and the source line SL is V1. In another example, a potential difference between the drain select transistor DST and the bit lines BLs is V1. V1 is a voltage threshold and is, for example, a voltage having a magnitude sufficient to generate a gate induced drain leakage (GIDL) current in at least one of the channel region of the source select transistor SST and the channel region of the drain select transistor DST. The GIDL current is generated when the voltage of at least one of the source line SL and the bit lines BLs reaches or exceeds V1.

When the potential of at least one of the source line SL and the bit lines BLs reaches V1, the erase operation controller 310 controls the row decoder 220 such that the drain select line DSL and the source select line SSL float. When the drain select line DSL is floating, hot holes, also referred to as hot electrons, are formed in the channel region of the drain select transistor DST due to the potential difference V1 between the gate of the drain select transistor DST and the plurality of bit lines BLs. The formed hot holes are moved to the channel regions of the plurality of memory cells. When the source select line SSL is floating, hot holes are formed in the channel region of the source select transistor SST due to the potential difference V1 between the gate of the source select transistor SST and the source line SL. The formed hot holes are moved to the channel regions of the plurality of memory cells.

In an embodiment of the present disclosure, the channel potential of the memory cells is controlled at a negative potential by applying the negative voltage Vneg to all word lines WLs during the period for the above-described GIDL current generation operation, for example, the first period of FIG. 6. Compared to the example when the ground voltage is applied to all word lines WLs, in the example when the negative voltage Vneg is applied to all word lines WLs, the channel potential of the memory cells is relatively low, and band-to-band generation of carriers between at least one of the source line SL and the bit lines BLs and the channels of the memory cells increases, resulting in an increase in the quantity of holes injected from at least one of the source line SL and the bit lines BLs into the channels. Accordingly, compared to the example when the ground voltage is applied to all word lines WLs, in the example when the negative voltage Vneg is applied to all word lines WLs, the potential of V1 may be at a lower value.

The potential of the drain select line DSL and the source select line SSL increases from a time at which the drain select line DSL and the source select line SSL begin floating as shown in FIG. 6. The increase in the potential of the drain select line DSL and the source select line SSL is caused, for example, by a coupling effect attributable to the increase in the potential of the plurality of bit lines BLs and the source line SL.

A second erase voltage Vera2 is applied S540 to at least one of the source line SL and the bit lines BLs during a second period as shown in FIG. 6. The second erase voltage Vera2 is a positive voltage maintained at a constant potential. In other words, the second erase voltage Vera2 is a flat or unchanging voltage potential during the second period.

For example, the voltage generating circuit 210 applies the second erase voltage Vera2 to the source line SL coupled to the selected memory block MB1 in response to receiving an operation signal OP_CMD during the second period. The page buffer group 230 applies the second erase voltage Vera2 to bit lines BLs of the memory cell array 100 in response to receiving the page buffer control signals PBSIGNALS during the second period.

The second period is a period corresponding to a data erase operation on memory cells using the GIDL current.

The ground voltage GND is applied S550 to the word lines WLs of the selected memory block during the second period. For example, the row decoder 220 applies the ground voltage GND to all word lines WLs of the selected memory block during the second period under the control of the erase operation controller 310.

During the second period, a positive potential is formed in the channel regions of the plurality of memory cells due to moving of the hot holes to the channel regions of the plurality of memory cells. In this example, electrons trapped in charge trap layers of memory cells included in the selected memory block are detrapped due to the potential difference between the word lines WLs of the selected memory block and the channel regions. Therefore, the threshold voltages of the memory cells decrease, whereby data stored in the memory cells is erased. The amount of detrapped electrons, among the electrons trapped in the charge trap layers, may be adjusted depending on the magnitude of the second erase voltage Vera2 or the time during which the second erase voltage Vera2 is applied.

Figure 7:
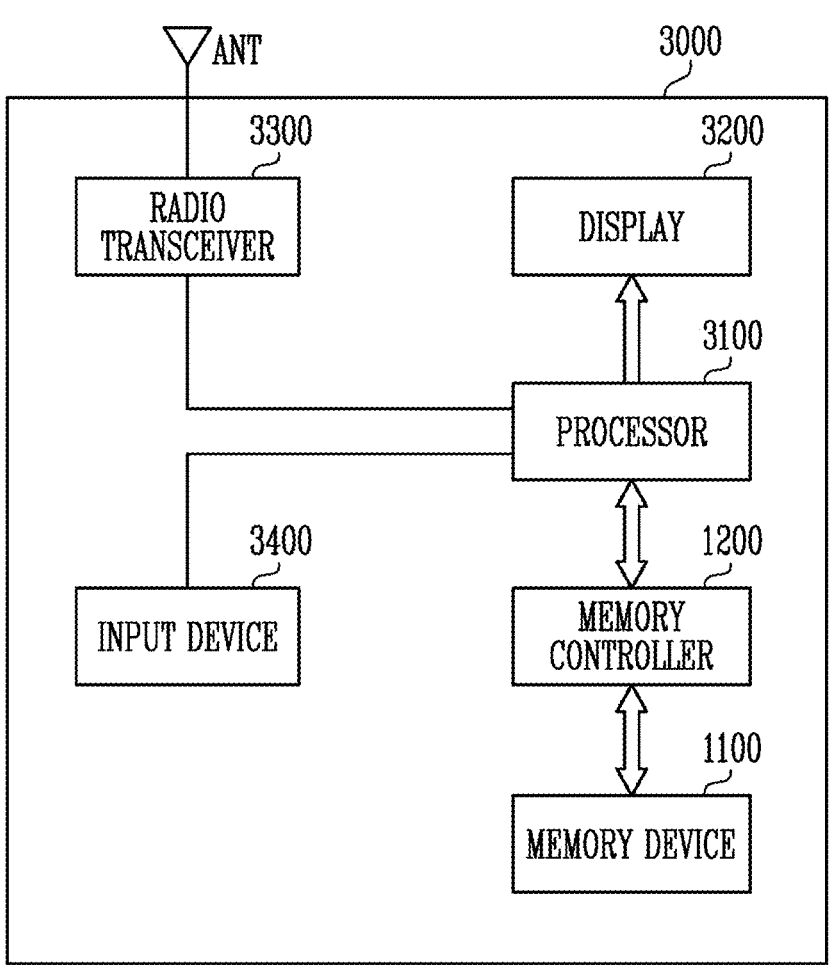
FIG. 7 is a diagram illustrating an embodiment of a memory system including the memory device.

FIG. 7 is a diagram illustrating an embodiment of a memory system including the memory device, for example, as shown in FIG. 2.

Referring to FIG. 7, a memory system 3000 may be a cellular phone, a smartphone, a tablet PC, a personal digital assistant (PDA), a wireless communication device, and so forth. The memory system 3000 includes a memory device 1100 and a memory controller 1200 that is capable of controlling the operation of the memory device 1100. The memory controller 1200 controls data access operations of the memory device 1100, for example, a program operation, an erase operation, and a read operation, under the control of a processor 3100. The memory device 1100 may rapidly increase a channel potential by applying a negative voltage to word lines of a selected memory block during a GIDL current generation operation of an erase operation, thus improving erase efficiency.

Data programmed into the memory device 1100 may be output via a display 3200 under the control of the memory controller 1200.

A radio transceiver 3300 exchanges or communicates radio signals through an antenna ANT. For example, the radio transceiver 3300 converts radio signals received through the antenna ANT into signals processed by the processor 3100. The processor 3100 processes the signals from the radio transceiver 3300 and transfers the processed signals, for example, to the memory controller 1200 or the display 3200. The memory controller 1200 may provide the signals processed by the processor 3100 to the memory device 1100. The radio transceiver 3300 convert signals output from the processor 3100 into radio signals and transmits the radio signals to an external device through the antenna ANT. An input device 3400 is a device used to input a control signal for controlling the operation of the processor 3100 or data to be processed by the processor 3100 and may be, for example, a pointing device such as a touch pad or a computer mouse, a keypad, a keyboard, and so forth. The processor 3100 controls the operation of the display 3200 such that data from the memory controller 1200, data from the radio transceiver 3300, and data from the input device 3400 are output via the display 3200.

In accordance with an embodiment, the memory controller 1200 capable of controlling the operation of the memory device 1100 may be part of the processor 3100 or an integrated circuit chip separate from the processor 3100.

Figure 8:
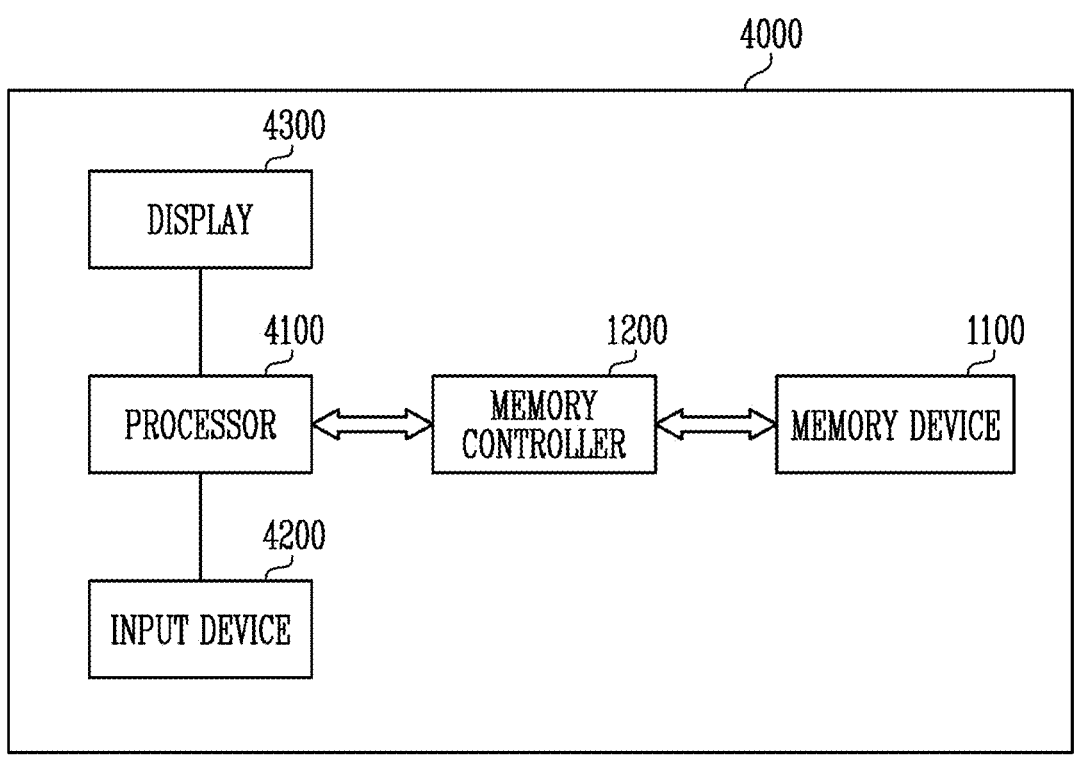
FIG. 8 is a diagram illustrating an embodiment of a memory system including the memory device.

FIG. 8 is a diagram illustrating an embodiment of a memory system including the memory device, for example, as shown in FIG. 2.

Referring to FIG. 8, a memory system 4000 may be a personal computer (PC), a tablet PC, a netbook, an e-reader, a personal digital assistant (PDA), a portable multimedia player (PMP), an MP3 player, an MP4 player, and so forth.

The memory system 4000 includes a memory device 1100 and a memory controller 1200 capable of controlling the data processing operation of the memory device 1100. The memory device 1100 performs data access operations, for example, a program operation, an erase operation, and a read operation under the control of the memory controller 1200. The memory device 1100 may rapidly increase a channel potential by applying a negative voltage to word lines of a selected memory block during a GIDL current generation operation of an erase operation, thus improving erase efficiency.

A processor 4100 outputs data stored in the memory device 1100 via a display 4300 according to data input from an input device 4200. The input device 4200 may be a pointing device such as a touch pad or a computer mouse, a keypad, or a keyboard.

The processor 4100 controls the overall operation of the memory system 4000 and controls the operation of the memory controller 1200. The memory controller 1200 capable of controlling the operation of the memory device 1100 may be part of the processor 4100 or an integrated circuit chip separate from the processor 4100.

Figure 9:
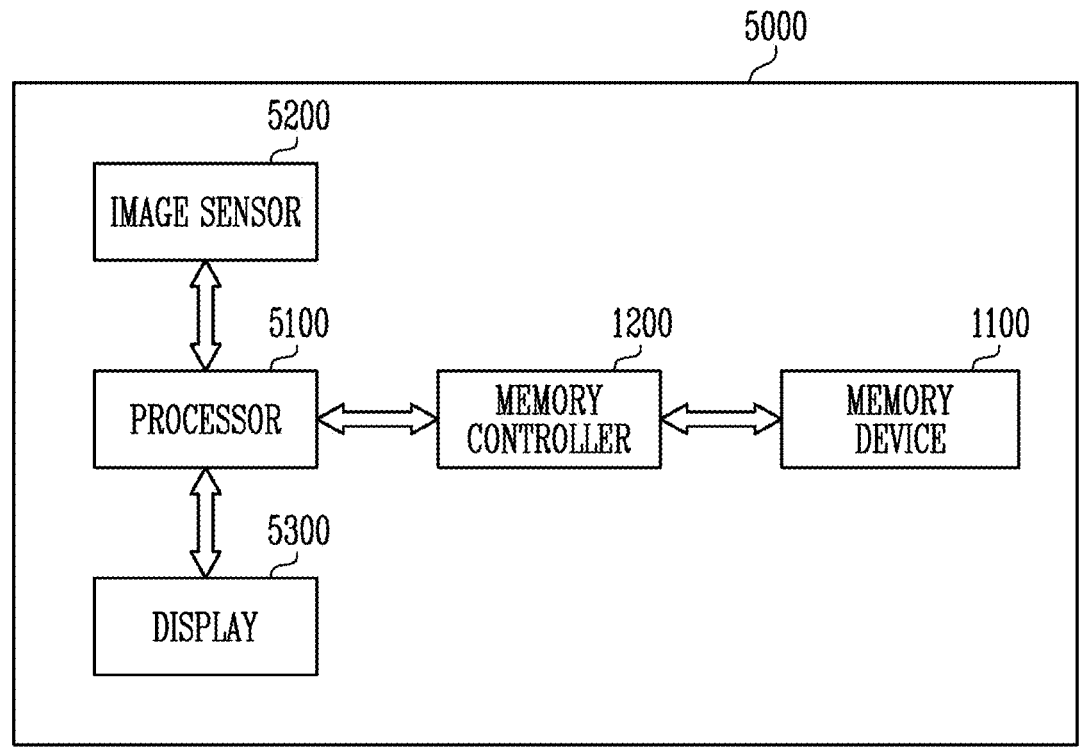
FIG. 9 is a diagram illustrating an embodiment of a memory system including the memory device.

FIG. 9 is a diagram illustrating an embodiment of a memory system including the memory device, for example, as shown in FIG. 2.

Referring to FIG. 9, a memory system 5000 may be an image processing device, for example, a digital camera, a cellular phone including a digital camera, a smartphone including a digital camera, a tablet PC including a digital camera, and so forth.

The memory system 5000 includes a memory device 1100 and a memory controller 1200 capable of controlling the data processing operations of the memory device 1100, for example, a program operation, an erase operation, and a read operation. The memory device 1100 may rapidly increase a channel potential by applying a negative voltage to word lines of a selected memory block during a GIDL current generation operation of an erase operation, thus improving erase efficiency.

An image sensor 5200 of the memory system 5000 converts an optical image into digital signals, and the digital signals are transmitted or transferred to a processor 5100 or the memory controller 1200. Under the control of the processor 5100, the digital signals may be output via a display 5300 or stored in the memory device 1100 through the memory controller 1200. The data stored in the memory device 1100 may be output via the display 5300 under the control of the processor 5100 or the memory controller 1200.

In accordance with an embodiment, the memory controller 1200 capable of controlling the operation of the memory device 1100 may be a part of the processor 5100 or an integrated circuit chip separate from the processor 5100.

Figure 10:
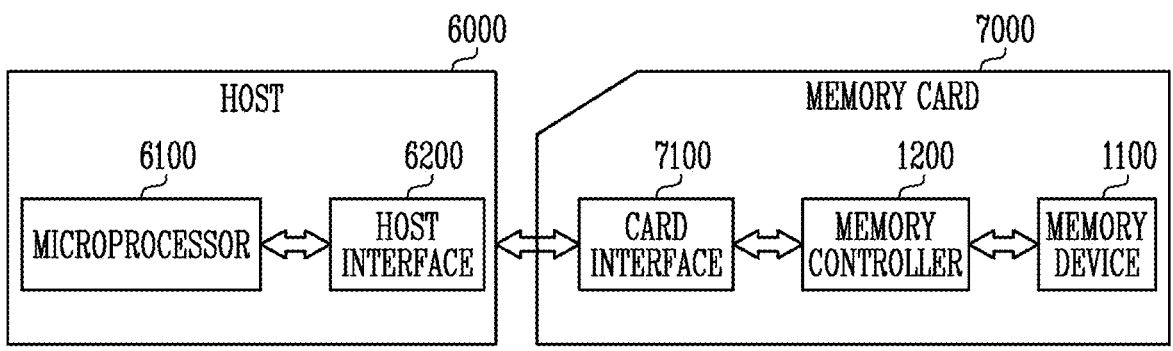
FIG. 10 is a diagram illustrating an embodiment of a memory system including the memory device.

FIG. 10 is a diagram illustrating an embodiment of a memory system including the memory device, for example, as shown in FIG. 2.

Referring to FIG. 10, a memory system 7000 may be a memory card or a smart card. The memory system 7000 includes a memory device 1100, a memory controller 1200, and a card interface 7100.

The memory device 1100 performs a data access operations, for example, a program operation, an erase operation, and a read operation under the control of the memory controller 1200. The memory device 1100 may rapidly increase a channel potential by applying a negative voltage to word lines of a selected memory block during a GIDL current generation operation of an erase operation, thus improving erase efficiency.

The memory controller 1200 controls data exchange between the memory device 1100 and the card interface 7100. The card interface 7100 may be, but is not limited to, a secure digital (SD) card interface or a multimedia card (MMC) interface.

The card interface 7100 provides an interface for data exchange between a host 6000 and the memory controller 1200 according to a protocol of the host 6000. The card interface 7100 may support a universal serial bus (USB) protocol, an interchip (IC)-USB protocol, and so forth. In this example, the card interface may refer to hardware capable of supporting a protocol used by the host 6000, software installed in the hardware, and/or a signal transmission method.

When the memory system 7000 is coupled to a host interface 6200 of the host 6000 such as a PC, a tablet PC, a digital camera, a digital audio player, a cellular phone, console video game hardware, a digital set-top box, and so forth, the host interface 6200 performs data communication with the memory device 1100 through the card interface 7100 and the memory controller 1200 under the control of a microprocessor 6100.

According to the present disclosure, erase efficiency may be increased by applying a negative voltage to word lines during an erase operation.

While the detailed embodiments of the present disclosure are disclosed in the present disclosure, those skilled in the art will understand that various modifications, additions, and substitutions related to these embodiments are possible without departing from the scope and technical spirit of the present disclosure. Therefore, the scope of the present disclosure should not be limited to the foregoing embodiments. All changes within the meaning and range of equivalency of the claims are to be included within their scope.

What is claimed is:

1. A memory device comprising:
a memory block including a plurality of memory cells;
peripheral circuits configured to perform an erase operation including a gate induced drain leakage (GIDL) current generation operation and a data erase operation using a GIDL current on the memory block; and
control logic configured to control the peripheral circuits to perform the erase operation;
wherein the control logic is configured to control the peripheral circuits to apply a negative voltage to word lines of the memory block during the GIDL current generation operation, and
wherein the peripheral circuits comprise:
a voltage generating circuit configured to generate a first erase voltage, apply the first erase voltage to a source line of the memory block, and generate the negative voltage during the GIDL current generation operation; and
a row decoder configured to apply the negative voltage generated by the voltage generating circuit to the word lines during the GIDL current generation operation and to apply a ground voltage to the word lines during the data erase operation.

2. The memory device according to claim 1,
wherein the voltage generating circuit is configured to generate a second erase voltage and apply the second erase voltage to the source line during the data erase operation.

3. The memory device according to claim 2,
wherein the first erase voltage is a positive voltage that increases with a constant slope, and the second erase voltage is a positive voltage that is maintained at a constant potential.

4. The memory device according to claim 1,
wherein the voltage generating circuit is configured to generate the negative voltage during at least part of a period of the GIDL current generation operation.

5. The memory device according to claim 1,
wherein the row decoder is configured to apply a ground voltage to a drain select line and a source select line of the memory block during the GIDL current generation operation and to cause the drain select line and the source select line to float when the first erase voltage reaches a voltage threshold.

6. The memory device according to claim 1,
wherein the peripheral circuits further comprise a page buffer group configured to apply the first erase voltage to bit lines of the memory block during the GIDL current generation operation and to apply the second erase voltage to the bit lines during the data erase operation.

7. The memory device according to claim 1,
wherein the control logic comprises an erase operation controller configured to control the peripheral circuits during the GIDL current generation operation and the data erase operation.

8. The memory device according to claim 7, wherein the voltage generating circuit comprises a negative voltage generator configured to generate the negative voltage under control of the erase operation controller during the GIDL current generation operation.

9. A memory device comprising:

a memory block including a plurality of memory cells;

a voltage generating circuit comprising a negative voltage generator, wherein the voltage generating circuit is configured to generate a first erase voltage and apply the first erase voltage to a source line of the memory block during a GIDL current generation operation of an erase operation, and to generate a second erase voltage and apply the second erase voltage to the source line during a data erase operation of the erase operation;

a row decoder configured to apply an operating voltage to word lines of the memory block; and an erase operation controller configured to control the voltage generating circuit and the row decoder during the erase operation, wherein the erase operation controller is configured to control the negative voltage generator to generate a negative voltage and control the row decoder to apply the negative voltage to the word lines during the GIDL current generation operation, and wherein the row decoder is configured to apply a ground voltage to a drain select line and a source select line of the memory block during the GIDL current generation operation, and to cause the drain select line and the source select line to float when the first erase voltage reaches a voltage threshold.

10. The memory device according to claim 9, wherein the row decoder is configured to apply a ground voltage to the word lines during the data erase operation.

11. The memory device according to claim 9, wherein the first erase voltage is a positive voltage that increases with a constant slope, and the second erase voltage is a positive voltage that is maintained at a constant potential.

12. The memory device according to claim 9, wherein the row decoder is configured to apply the negative voltage to the word lines during at least part of a period of the GIDL current generation operation.

13. The memory device according to claim 9, further comprising a page buffer group configured to apply the first erase voltage to bit lines of the memory block during the GIDL current generation operation and to apply the second erase voltage to the bit lines during the data erase operation.

14. A method of operating a memory device, the method comprising:

applying a first erase voltage to a source line or bit lines of a memory block during a first period;

applying a negative voltage to word lines of the memory block during at least part of the first period;

applying a second erase voltage to the source line or the bit lines during a second period following the first period; and applying a ground voltage to the word lines during the second period.

15. The method according to claim 14, wherein the first erase voltage is a positive voltage that increases with a constant slope, and the second erase voltage is a positive voltage that is maintained at a constant potential.

16. The method according to claim 15, further comprising, during the first period, causing a drain select line and a source select line of the memory block to float when the first erase voltage reaches a voltage threshold.

17. The method according to claim 14, wherein, during the first period, a potential of a channel of memory cells included in the memory block decreases due to the negative voltage applied to the word lines.

18. The method according to claim 14, wherein the first period is a period including a gate induced drain leakage current generation operation and the second period is a period including a data erase operation.

19. A method comprising:

during a first period:

applying a first erase voltage to a source line or bit lines of a memory block at least until the first erase voltage reaches a voltage threshold, wherein a gate induced drain leakage current is generated when the first erase voltage reaches the voltage threshold;

causing a drain select line and a source select line to float when the first erase voltage reaches the voltage threshold; and applying a negative voltage to word lines of the memory block; and during a second period following the first period:

applying a second erase voltage to the source line or the bit lines during; and applying a ground voltage to the word lines.

* * * * *